(12) United States Patent
Ahn et al.

(10) Patent No.: US 9,024,202 B2
(45) Date of Patent: May 5, 2015

(54) ELECTRONIC CHIP COMPONENT AND BOARD HAVING THE SAME MOUNTED THEREON

(71) Applicant: Samsung Electro-Mechanics Co., Ltd., Suwon, Gyunggi-do (KR)

(72) Inventors: Young Ghyu Ahn, Gyunggi-do (KR); Soon Ju Lee, Gyunggi-do (KR); Heung Kil Park, Gyunggi-do (KR); Sang Soo Park, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 0 days.

(21) Appl. No.: 14/137,741

(22) Filed: Dec. 20, 2013

(65) Prior Publication Data

US 2015/0041195 A1    Feb. 12, 2015

(30) Foreign Application Priority Data

Aug. 9, 2013  (KR) .................. 10-2013-0094839

(51) Int. Cl.
*H05K 1/00*   (2006.01)
*H01G 2/06*   (2006.01)
*H05K 1/18*   (2006.01)
*H05K 1/03*   (2006.01)

(52) U.S. Cl.
CPC ............... *H01G 2/065* (2013.01); *H05K 1/181* (2013.01); *H05K 1/0306* (2013.01)

(58) Field of Classification Search
CPC .... H05K 1/181; H05K 1/0306; H05K 3/4629
See application file for complete search history.

(56) References Cited

U.S. PATENT DOCUMENTS

| 2004/0066589 A1 | 4/2004 | Togashi et al. |
| 2013/0033836 A1 | 2/2013 | Hattori et al. |
| 2013/0037911 A1 | 2/2013 | Hattori et al. |

FOREIGN PATENT DOCUMENTS

| JP | 2004-134430 A | 4/2004 |
| JP | 2013-038144 A | 2/2013 |
| KR | 10-2013-0016099 A | 2/2013 |
| KR | 10-2013-0018146 A | 2/2013 |

OTHER PUBLICATIONS

Notice of Office Action dated Aug. 3, 2014 issued in Korean Patent Application No. 20-2013-0094839 (English translation).

*Primary Examiner* — Jeremy C Norris
(74) *Attorney, Agent, or Firm* — McDermott Will & Emery LLP (57) ABSTRACT

An electronic chip component includes a ceramic body; external electrodes formed on end portions of the ceramic body; an interposer supporting the ceramic body and electrically connected to the external electrodes, wherein the interposer includes a first electrode pad formed on a surface thereof and having the external electrodes disposed thereon, a second electrode pad formed on an opposing surface thereof, and a connection electrode pad connecting the first electrode pad to the second electrode pad and formed on a lateral surface between the surface and the opposing surface of the interposer, the first electrode pad is divided into first and second electrode patterns disposed at ends of the interposer based on a space formed therebetween, a non-electrode margin portion is formed between ends of the first electrode pad and ends of the interposer, and the connection electrode pad is formed on the lateral surface of the interposer.

18 Claims, 10 Drawing Sheets

ELECTRONIC CHIP COMPONENT AND BOARD HAVING THE SAME MOUNTED THEREON

CROSS-REFERENCE TO RELATED APPLICATION

This application claims the benefit of Korean Patent Application No. 10-2013-0094839 filed on Aug. 9, 2013, with the Korean Intellectual Property Office, the disclosure of which is incorporated herein by reference.

BACKGROUND

The present disclosure relates to an electronic chip component including an interposer to reduce acoustic noise and a board having the same mounted thereon.

A multilayer ceramic capacitor, an electronic chip component, is configured to have internal electrodes formed between a plurality of dielectric layers. External electrodes are formed on both end portions of the multilayer ceramic capacitor in a length direction thereof and are soldered to be electrically and physically connected to lands for mounting the component on a printed circuit board (PCB).

When direct current (DC) voltage and alternating current (AC) voltage are applied to the multilayer ceramic capacitor in which the internal electrodes are overlapped with each other, having the dielectric layers interposed therebetween, a piezoelectric phenomenon occurs and vibrations occur between the internal electrodes.

The vibrations may be transmitted from the external electrodes of the multilayer ceramic capacitor to the PCB having the multilayer ceramic capacitor mounted thereon. In this case, the PCB is vibrated to generate noise.

That is, when the noise generated due to the vibrations of the PCB is within an audio frequency of 20 Hz to 20,000 Hz, the vibration sound may cause listener discomfort, which is commonly known as acoustic noise.

Recently, in order to reduce acoustic noise, an electronic chip component having an interposer additionally formed on a mounting surface of the electronic chip component mounted on a PCB has been introduced.

However, in the case of the electronic chip component having the interposer, displacement of head surfaces (opposing end surfaces of the multilayer ceramic capacitor in a length direction) of the multilayer ceramic capacitor may directly affect the PCB. Here, the head surfaces have the largest displacement when voltage is applied to the multilayer ceramic capacitor.

That is, in an electronic chip component including an interposer disclosed in Patent Documents 1 and 2, external electrodes formed on head surfaces of the electronic chip component are electrically and physically connected to a PCB via soldering, and thus, displacement of the head surfaces having the largest displacement directly affects the PCB. Accordingly, such a structure may fail to remarkably reduce acoustic noise.

RELATED ART DOCUMENT (Patent Document 1) Japanese Patent Laid-Open Publication No. 2004-134430
(Patent Document 2) Japanese Patent Laid-Open Publication No. 2013-038144

SUMMARY

An aspect of the present disclosure may provide an electronic chip component including an interposer to reduce acoustic noise and a board having the same mounted thereon.

According to an aspect of the present disclosure, an electronic chip component may include: a ceramic body; external electrodes formed on end portions of the ceramic body in a length direction thereof; an interposer supporting the ceramic body and electrically connected to the external electrodes, wherein the interposer includes a first electrode pad formed on a surface thereof and having the external electrodes disposed thereon, a second electrode pad formed on an opposing surface thereof, and a connection electrode pad connecting the first electrode pad to the second electrode pad and formed on a lateral surface of the interposer between the surface and the opposing surface of the interposer, the first electrode pad is divided into a first electrode pattern and a second electrode pattern disposed at ends of the interposer based on a space formed therebetween, a non-electrode margin portion is formed between ends of the first electrode pad in a length direction of the interposer and the ends of the interposer in the length direction thereof, and the connection electrode pad is formed on the lateral surface of the interposer forming the space.

The space may be provided as a through hole and the through hole may be disposed in a central portion of the interposer.

The space may be provided as indent portions formed inwardly from ends of the interposer in a width direction thereof.

Head surfaces of the external electrodes may be disposed on the non-electrode margin portion when the external electrodes are disposed on the interposer.

The non-electrode margin portion may be further formed on ends of the interposer in a width direction thereof, and lateral surfaces of the external electrodes may be disposed on the non-electrode margin portion when the external electrodes are disposed on the interposer.

The external electrodes may be extended inwardly from the end portions of the ceramic body in the length direction thereof, and internal edges of the external electrodes may be disposed adjacently to the space when the external electrodes are disposed on the interposer.

The internal edges of the external electrodes may be disposed above the space.

The internal edges of the external electrodes may be disposed on the first electrode pattern and the second electrode pattern.

The ceramic body may include internal electrodes and dielectric layers alternately stacked therein, and the internal electrodes may be disposed in parallel to the first electrode pad.

According to another aspect of the present disclosure, a board having an electronic chip component mounted thereon, the board may include: the electronic chip component as described above and a printed circuit board (PCB) a printed circuit board (PCB) including land patterns electrically connected to the second electrode pad to be connected to the electronic chip component, wherein the land patterns may be soldered to be electrically connected to the external electrodes through the connection electrode pad disposed in the space.

The space may be provided as a through hole having a rectangular shape, and the electronic chip component may be soldered along the connection electrode pad in the through hole.

The space may be provided as indent portions formed inwardly from ends of the interposer in a width direction thereof, and the electronic chip component may be soldered along the connection electrode pad in the indent portions.

Head surfaces of the external electrodes may be disposed on the non-electrode margin portion when the external electrodes are disposed on the interposer.

The non-electrode margin portion is further formed on ends of the interposer in a width direction thereof, and lateral surfaces of the external electrodes may be disposed on the non-electrode margin portion when the external electrodes are disposed on the interposer.

The external electrodes may be extended inwardly from the end portions of the ceramic body in the length direction thereof, and internal edges of the external electrodes may be disposed adjacently to the space when the external electrodes are disposed on the interposer.

The internal edges of the external electrodes may be disposed above the space.

The internal edges of the external electrode may be disposed on the first electrode pattern and the second electrode pattern.

The ceramic body may include internal electrodes and dielectric layers alternately stacked therein, and the internal electrodes may be disposed in parallel to the first electrode pad.

BRIEF DESCRIPTION OF DRAWINGS

The above and other aspects, features and other advantages of the present disclosure will be more clearly understood from the following detailed description taken in conjunction with the accompanying drawings, in which:

FIGS. 2A through 2E are views illustrating an interposer according to a first embodiment of the present disclosure.

FIGS. 3A through 3E are views illustrating an interposer according to a second embodiment of the present disclosure.

DETAILED DESCRIPTION

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

An electronic chip component according to an embodiment of the present disclosure may include a multilayer ceramic capacitor, a multilayer varistor, a thermistor, a piel-ezoelectric device, a multilayer substrate, and the like, in which dielectric layers are stacked and internal electrodes face each other having each of the dielectric layers interposed therebetween.

Electronic Chip Component

Hereinafter, an electronic chip component according to an embodiment of the present disclosure will be described by taking a chip capacitor as an example.

Figure 1:
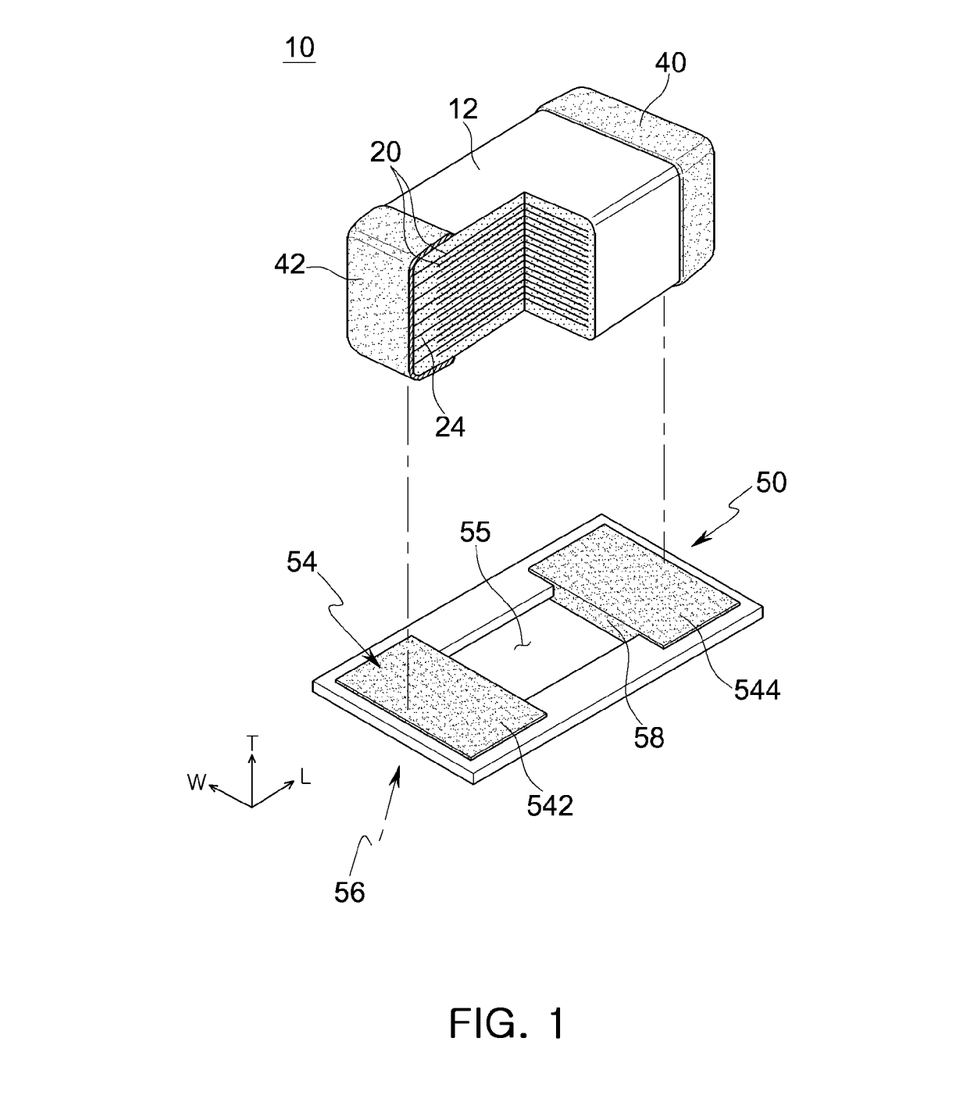
FIG. 1 is a schematic exploded perspective view of an electronic chip component according to an embodiment of the present disclosure.
Figure 2A:
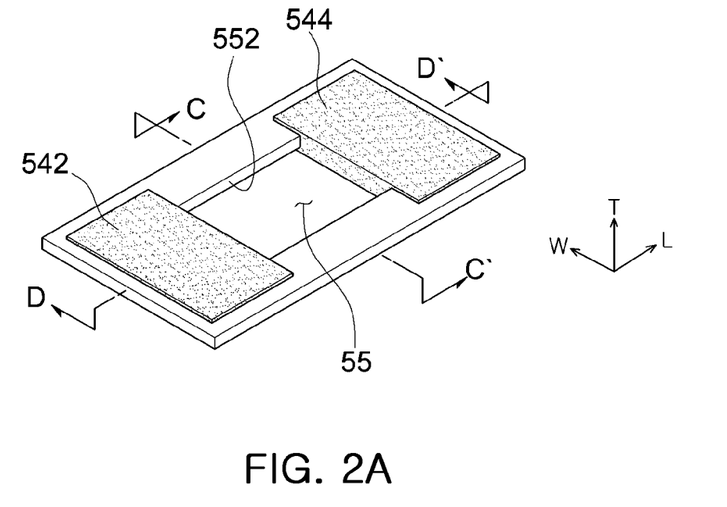
FIG. 2A is a perspective view of the interposer.
Figure 2B:
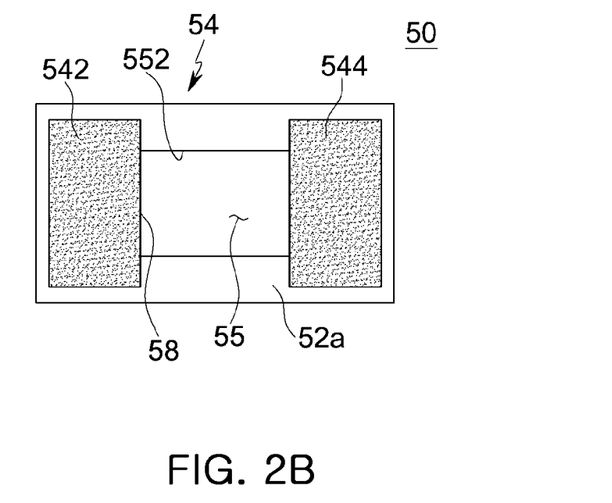
FIG. 2B is a plan view of the interposer.
Figure 2C:
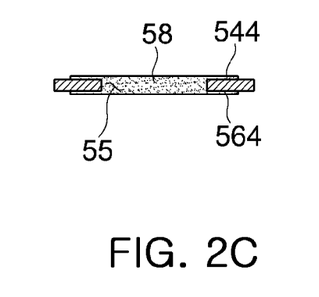
FIG. 2C is a cross-sectional view of the interposer taken along line C-C' of FIG. 2A.
Figure 2D:
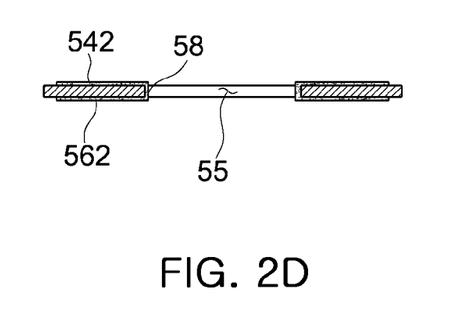
FIG. 2D is a cross-sectional view of the interposer taken along line D-D' of FIG. 2A.
Figure 2E:
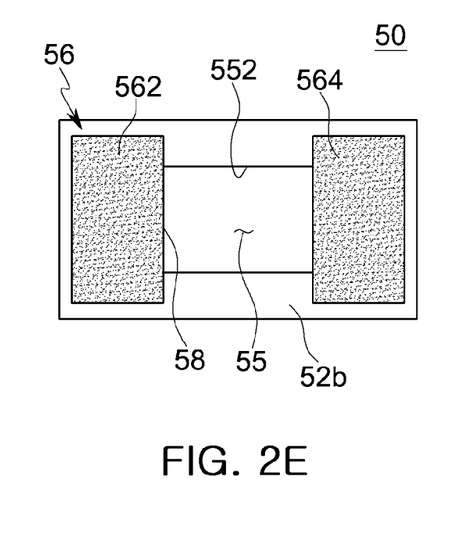
FIG. 2E is a bottom view of the interposer.
Figure 3A:
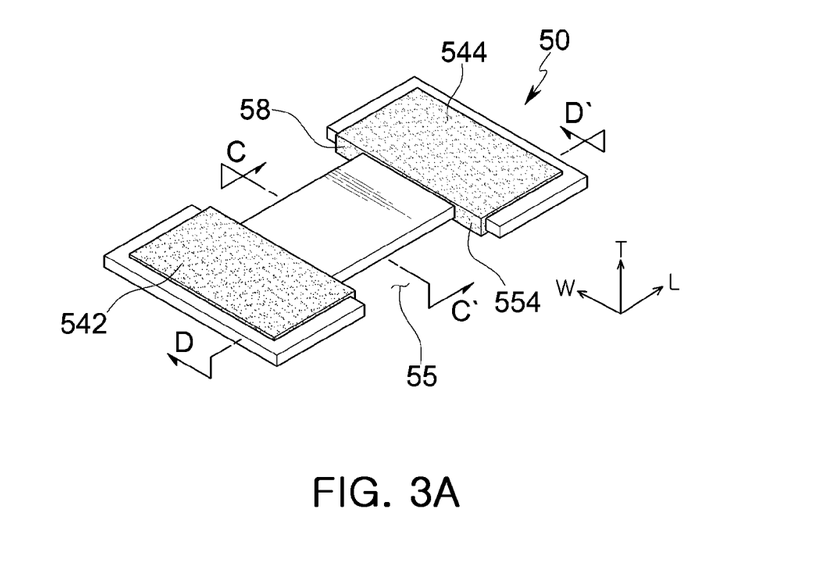
FIG. 3A is a perspective view of the interposer.
Figure 3B:
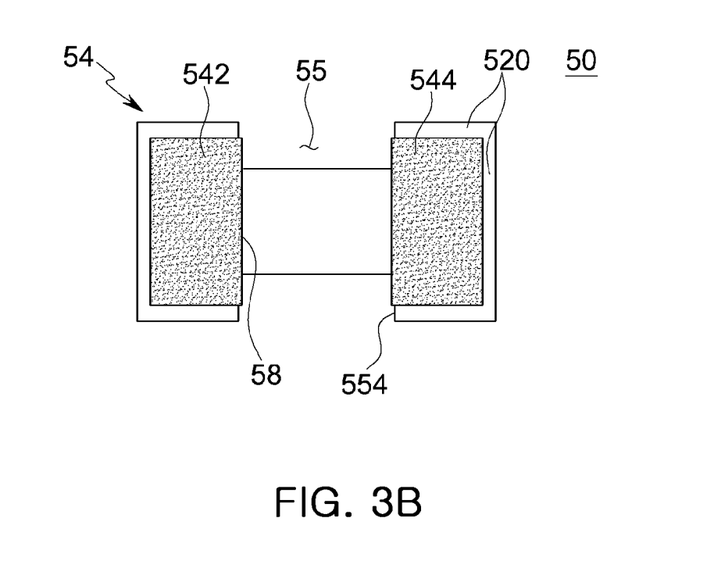
FIG. 3B is a plan view of the interposer.
Figure 3C:
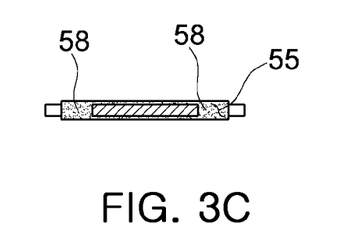
FIG. 3C is a cross-sectional view of the interposer taken along line C-C' of FIG. 3A.
Figure 3D:
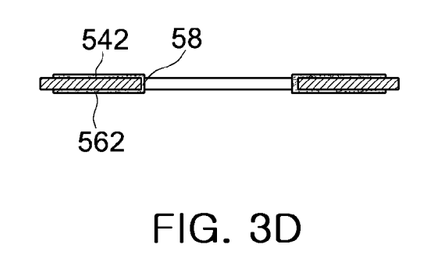
FIG. 3D is a cross-sectional view of the interposer taken along line D-D' of FIG. 3A.
Figure 3E:
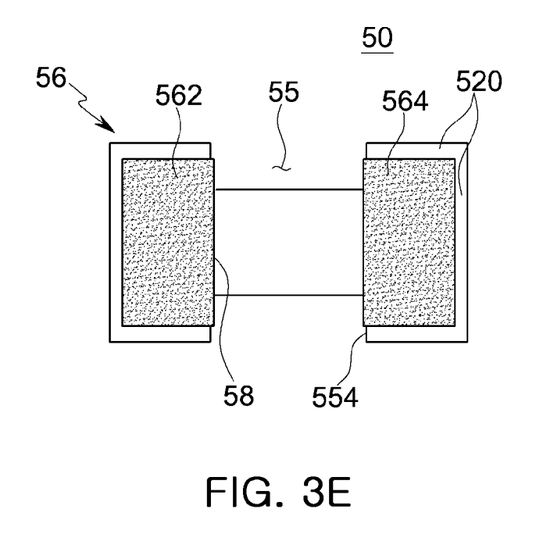
FIG. 3E is a bottom view of the interposer.

FIG. 1 is a schematic exploded perspective view of an electronic chip component according to an embodiment of the present disclosure.

Referring to FIG. 1, a chip capacitor 10 may include a ceramic body 12, external electrodes 40, and an interposer 50.

The ceramic body 12 may be manufactured by applying a conductive paste to ceramic green sheets to form internal electrodes 20 thereon, stacking the ceramic green sheets having the internal electrodes 20 formed thereon, and sintering the same. A plurality of dielectric layers 24 and the internal electrodes 20 may be repeatedly stacked to form the ceramic body 12.

The ceramic body 12 may have a hexahedral shape. The ceramic body 12 may have a substantially hexahedral shape, rather than a perfectly hexahedral shape with complete straight lines, due to sintering shrinkage of a ceramic powder during sintering.

In order to clearly describe embodiments of the present disclosure, directions of the hexahedron are defined: L, W, and T in FIG. 1 denote a length direction, a width direction, and a thickness direction of the ceramic body, respectively. Here, the thickness direction may also refer to a stacking direction in which dielectric layers are stacked.

As illustrated in FIG. 1, the chip capacitor 10 has a rectangular parallelepiped shape, lines of which in the length direction are longer than lines in the width or thickness direction.

The external electrodes 40 may be formed of a conductive paste including a metallic powder. The metallic powder included in the conductive paste may be formed of copper (Cu), nickel (Ni), or an alloy thereof, but is not limited thereto.

The external electrodes 40 may be formed on end portions of the ceramic body 12 in the length direction thereof and be extended inwardly from the end portions of the ceramic body 12 in the length direction to cover the end portions of the ceramic body 12 in the length direction.

The dielectric layers 24 may be formed of a ceramic powder having high permittivity to implement high capacitance. The ceramic powder may include, for example, a barium titanate ($BaTiO_3$) based powder, a strontium titanate ($SrTiO_3$) based powder, or the like, but is not limited thereto.

The dielectric layers 24 may be formed by stacking and compressing a plurality of ceramic green sheets and then sintering the same. In this case, each of the dielectric layers 24 may be formed between the internal electrodes 20 and adjacent dielectric layers 24 may be integrated with each other such that boundaries therebetween are not readily apparent without a scanning electron microscope (SEM).

The interposer 50 may be a thin substrate having a plate shape and may have a width and a length substantially equal to or slightly greater than the width and the length of the chip capacitor 10.

The interposer 50 may include a first electrode pad 54, a second electrode pad 56, and a connection electrode pad 58. In addition, the first electrode pad 54 may include a first electrode pattern 542 and a second electrode pattern 544 and the second electrode pad 56 may include a first electrode pattern 562 and a second electrode pattern 564, the first and second electrode patterns being separated from each other via a space 55.

Here, the first electrode pad 54 and the second electrode pad 56 may be electrodes formed on a surface 52a and an opposing surface 52b of the interposer 50, respectively.

Hereinafter, examples of an interposer will be described with reference to FIGS. 2 and 3.

FIG. 2 illustrates an interposer according to a first embodiment of the present disclosure. FIG. 2A is a perspective view of the interposer, FIG. 2B is a plan view of the interposer, FIG. 2C is a cross-sectional view of the interposer taken along line C-C' of FIG. 2A, FIG. 2D is a cross-sectional view of the interposer taken along line D-D' of FIG. 2A, and FIG. 2E is a bottom view of the interposer.

Referring to FIG. 2, in the interposer 50 according to the first embodiment, the space 55 for dividing the first electrode pad 54 into the first electrode pattern 542 and the second electrode pattern 544 may be formed as a through hole 552.

As illustrated in FIG. 2, the interposer 50 may include the first electrode pad 54, the second electrode pad 56, and the connection electrode pad 58. The first electrode pad 54 may be formed on the surface 52a of the interposer 50 and electrically connected to the external electrodes 40. In addition, the second electrode pad 56 may be formed on the surface 52b of the interposer 50 opposing the surface 52a thereof.

The second electrode pad 56 may also include the first electrode pattern 562 and the second electrode pattern 564 separated from each other by the through hole 552 forming the space 55. The second electrode pad 56 may be soldered to land patterns 122 and 124 of a printed circuit board (PCB) 120 (refer to FIG. 6), so that they may be electrically connected to one another.

The connection electrode pad 58 may connect the first electrode pad 54 and the second electrode pad 56 to each other and may be formed on a lateral surface of the interposer between the surface 52a and the opposing surface 52b.

FIG. 3 illustrates an interposer according to a second embodiment of the present disclosure. FIG. 3A is a perspective view of the interposer, FIG. 3B is a plan view of the interposer, FIG. 3C is a cross-sectional view of the interposer taken along line C-C' of FIG. 3A, FIG. 3D is a cross-sectional view of the interposer taken along line D-D' of FIG. 3A, and FIG. 3E is a bottom view of the interposer.

Referring to FIG. 3, in the interposer 50 according to the second embodiment, the space 55 for dividing the first electrode pad 54 into the first electrode pattern 542 and the second electrode pattern 544 may be formed as indent portions 554.

The indent portions 554 may be formed by cutting end portions of the interposer 50 in the width direction thereof inwardly to thereby form the space 55.

The interposer 50 according to the second embodiment is different from the interposer 50 according to the first embodiment in terms of a method of forming the space 55. Details of the first electrode pad 54, the second electrode pad 56, and the connection electrode pad 58 included in the interposer 50 according to the second embodiment are substantially the same as those of the interposer 50 according to the first embodiment.

Figure 4:
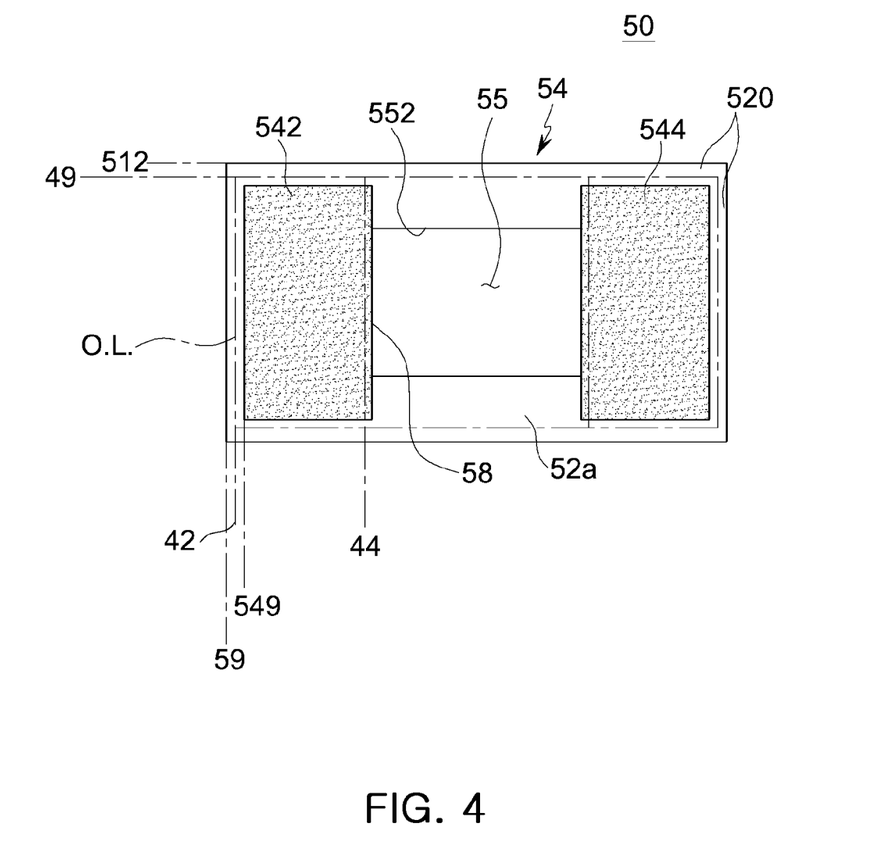
FIG. 4 is a schematic diagram obtained by transparently projecting an electronic chip component onto the plan view of the interposer according to the first embodiment.
Figure 5:
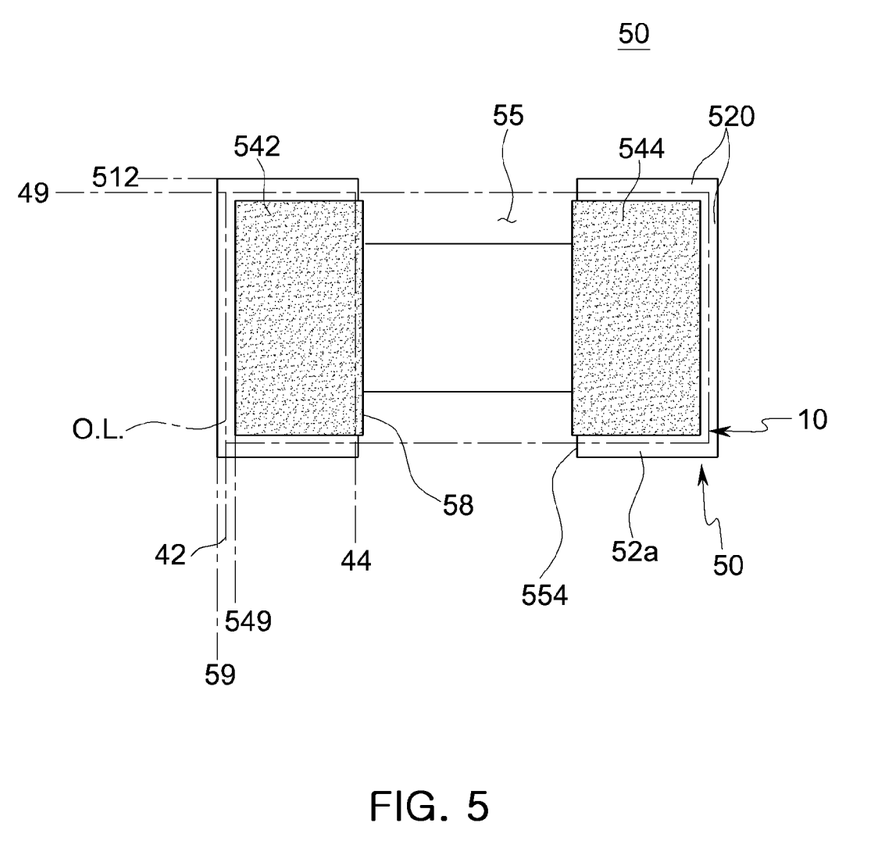
FIG. 5 is a schematic diagram obtained by transparently projecting an electronic chip component onto the plan view of the interposer according to the second embodiment.

FIG. 4 is a schematic diagram obtained by transparently projecting an electronic chip component onto the plan view of the interposer 50 according to the first embodiment. FIG. 5 is a schematic diagram obtained by transparently projecting an electronic chip component onto the plan view of the interposer 50 according to the second embodiment.

Referring to FIG. 4, in the interposer 50 according to the first embodiment, a non-electrode margin portion 520 may be formed between ends 549 of the first electrode pattern 542 in the length direction of the interposer 50 and ends 59 of the interposer 50 in the length direction.

The non-electrode margin portion 520 may have a thin strip shape along an external surface of the interposer 50. That is, the non-electrode margin portion 520 may also be formed on ends 512 of the interposer 50 in the width direction thereof.

When the external electrodes 40 are projected onto the interposer 50, head surfaces 42 of the external electrodes 40 may be disposed in the non-electrode margin portion 520.

Since the head surfaces 42 of the external electrodes 40 are disposed in the non-electrode margin portion 520, a solder paste of the first electrode pad 54 may be prevented from being melted and moving onto the head surfaces 42 of the external electrodes 40. In addition, the non-electrode margin portion 520 is formed on the ends 512 of the interposer 50 in the width direction thereof, thereby preventing the solder paste of the first electrode pad 54 from being melted and moving onto lateral surfaces 49 of the external electrodes 40.

Referring to FIG. 5, as the interposer 50 according to the first embodiment, the interposer 50 according to the second embodiment also includes the non-electrode margin portion 520 formed between the ends 549 of the first electrode pattern 542 in the length direction of the interposer 50 and the ends 59 of the interposer 50 in the length direction.

The non-electrode margin portion 520 of the interposer 50 according to the second embodiment may also prevent the solder paste of the first electrode pad 54 from being melted and moving onto the head surfaces 42 and the lateral surfaces 49 of the external electrodes 40.

Board Having Electronic Chip Component Mounted Thereon

Figure 6:
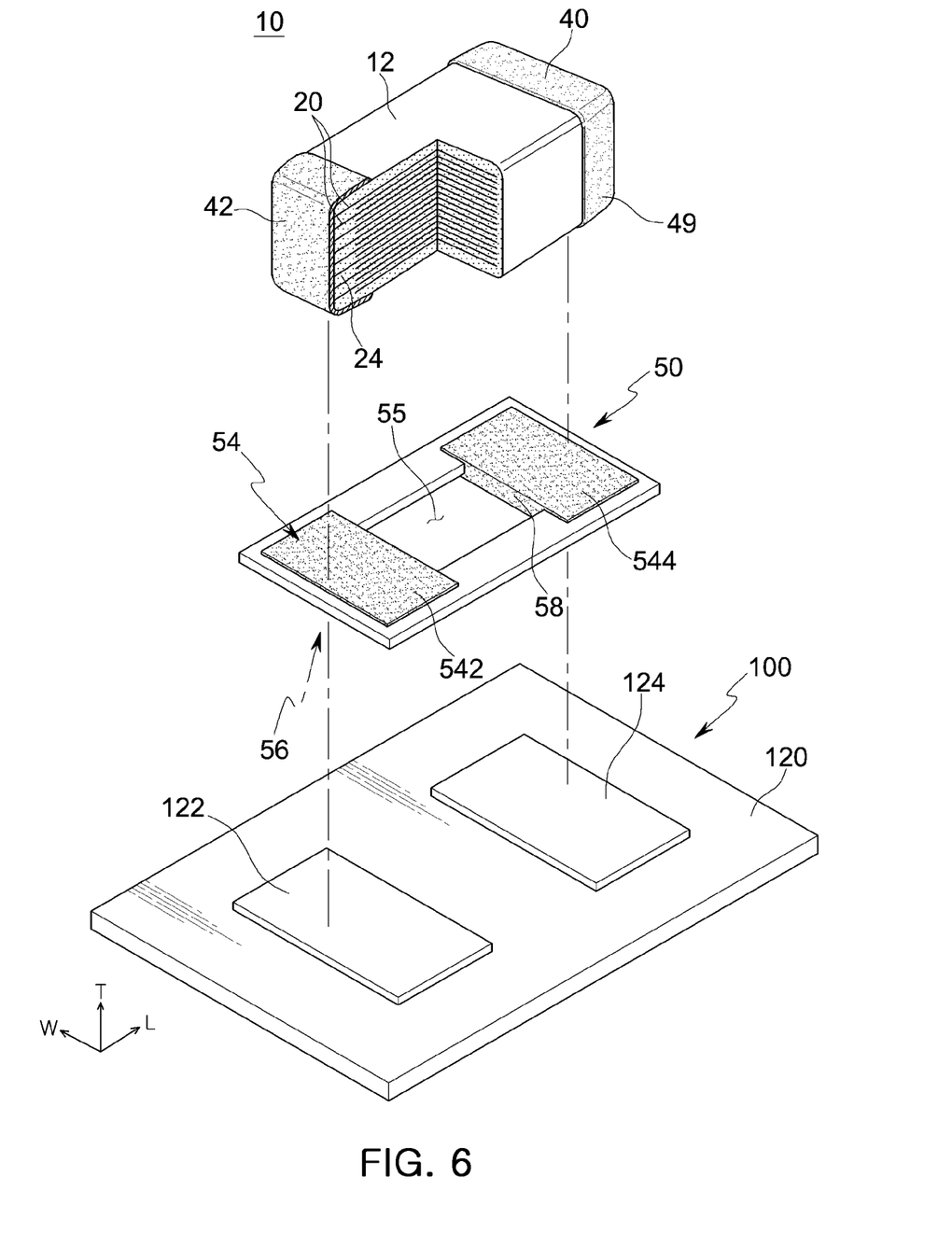
FIG. 6 is a schematic exploded perspective view of a printed circuit board (PCB) having an electronic chip component mounted thereon according to an embodiment of the present disclosure.
Figure 7:
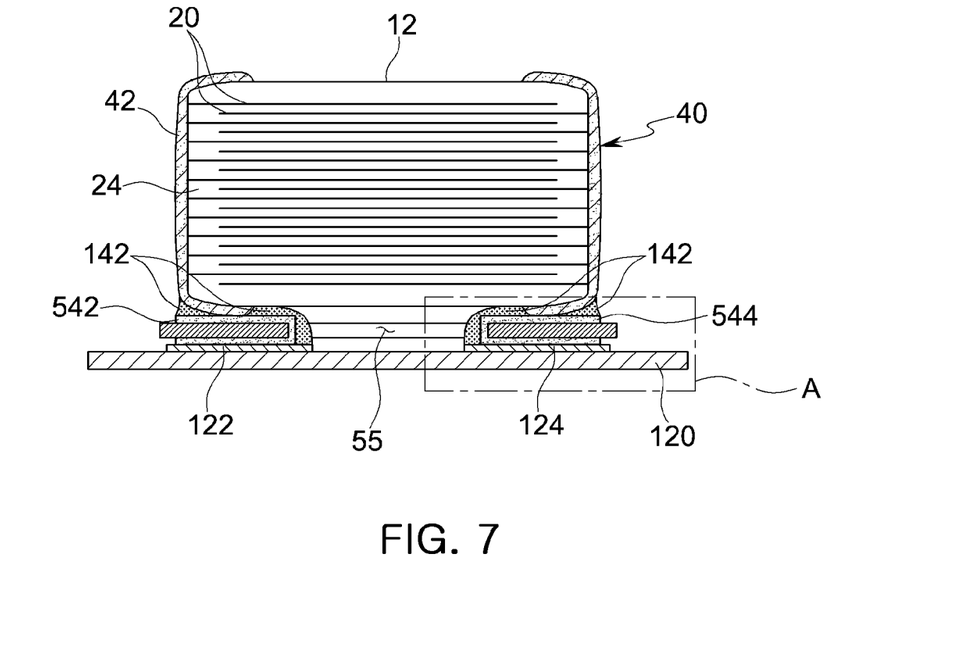
FIG. 7 is a schematic cross-sectional view of the PCB of FIG. 6 having an electronic chip component mounted thereon.

FIG. 6 is a schematic exploded perspective view of a PCB having an electronic chip component mounted thereon according to an embodiment of the present disclosure. FIG. 7 is a schematic cross-sectional view of the PCB of FIG. 6 having the electronic chip component mounted thereon.

Figure 8:
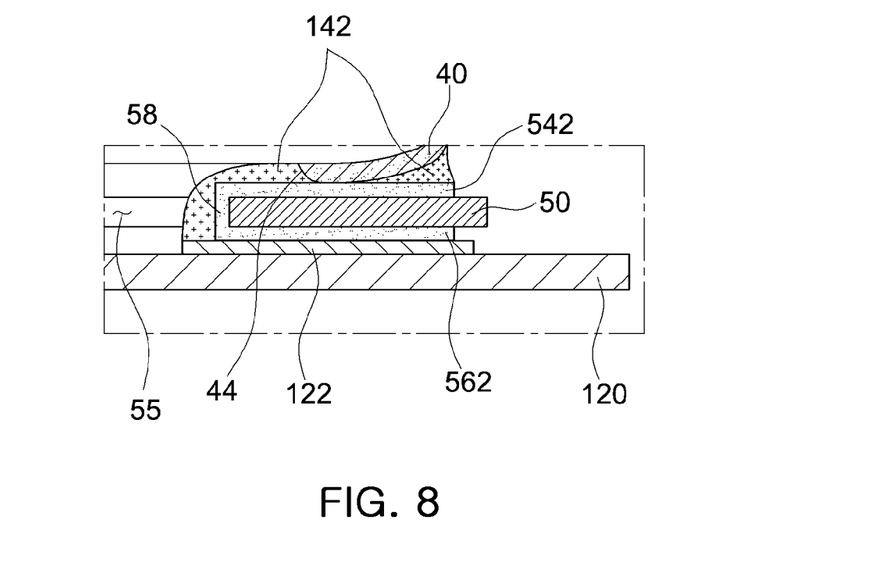
FIG. 8 is an enlarged view of portion 'A' of FIG. 7 according to an embodiment of the present disclosure.
Figure 9:
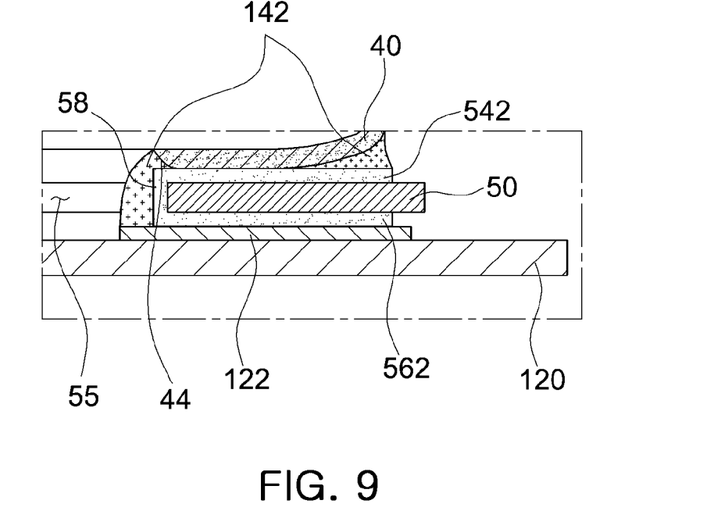
FIG. 9 is an enlarged view of portion 'A' of FIG. 7 according to another embodiment of the present disclosure.

In addition, FIG. 8 is an enlarged view of portion 'A' of FIG. 7 according to an embodiment of the present disclosure. FIG. 9 is an enlarged view of portion 'A' of FIG. 7 according to another embodiment of the present disclosure.

Figure 10:
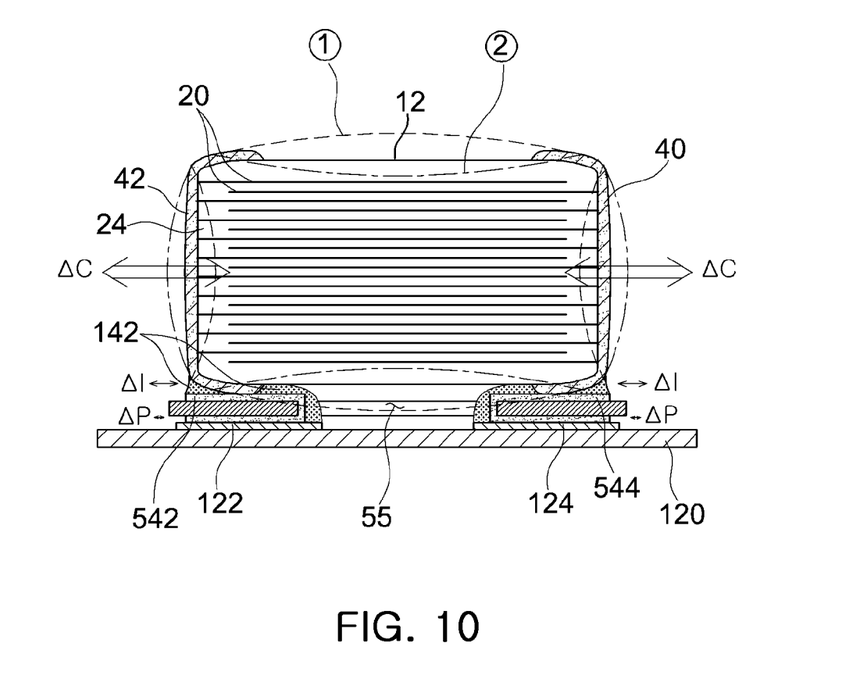
FIG. 10 is a schematic cross-sectional view illustrating deformation of an electronic chip component when power is applied to a PCB having the electronic chip component mounted thereon.

FIG. 10 is a schematic cross-sectional view illustrating deformation of an electronic chip component when power is applied to a PCB having the electronic chip component mounted thereon.

Referring to FIGS. 6 to 10, a board 100 having an electronic chip component mounted thereon according to an embodiment of the present disclosure may include an electronic chip component including the aforementioned interposer 50 and the PCB 120. Here, the electronic chip component may be the chip capacitor 10 including the ceramic body 12 in which the internal electrodes 20 and the dielectric layers 24 are alternately stacked, and the internal electrodes 20 having the dielectric layers 24 interposed therebetween may be extended to be connected to the external electrodes 40 having different polarities and formed on end portions of the ceramic body 12 in the length direction thereof.

The internal electrodes 20 may be formed in parallel to the first electrode pad 54.

The PCB 120 may include the land patterns 122 and 124 electrically connected to the second electrode pad 56 of the interposer 50 and making connection with the electronic chip component, that is, the chip capacitor 10.

When voltage is applied to the chip capacitor 10 in a state in which the chip capacitor 10 is mounted on the PCB 120, acoustic noise may be generated in the board 100 having the electronic chip component mounted thereon.

That is, when voltages having different polarities are applied to the external electrodes 40 formed on the end portions of the chip capacitor 10, the ceramic body 12 may expand (①) of FIG. 10) and contract a (②) of FIG. 10) in the thickness direction due to an inverse piezoelectric effect of the dielectric layers, and the head surfaces 42 of the external electrodes 40 may contract and expand in the length direction of the ceramic body due to a Poisson effect, which is opposed to the expansion and contraction of the ceramic body 12 in the thickness direction.

The board 100 having the electronic chip component mounted thereon according to the present embodiment may prevent vibrations of the chip capacitor 10 from being transmitted to the PCB 120 to thereby reduce acoustic noise.

According to the present embodiment, the interposer 50 may be additionally formed to primarily prevent the vibrations of the chip capacitor 10 from being transmitted to the PCB 120 and to secondarily prevent the PCB 120 and the head surfaces 42 of the external electrodes 40 having the largest displacement in the chip capacitor 10 from being soldered directly to each other, thereby reducing acoustic noise.

In addition, the interposer 50 may also prevent the PCB 120 and the lateral surfaces 49 of the external electrodes 40 from being soldered directly to each other, thereby minimizing the transmission of vibrations generated from the chip capacitor 10 to the PCB 120.

That is, the chip capacitor 10 may be soldered to the PCB 120 using a solder 142 via the space 55 formed in the interposer 50 and the connection electrode pad 58 for connection between the first electrode pad 54 formed on the surface 52a of the interposer 50 and the second electrode pad 56 formed on the opposing surface 52b thereof.

A soldering paste may be disposed on the land patterns 122 and 124 of the PCB 120. When soldering is performed at a high temperature, the soldering paste is melted and fused on the electrode patterns formed of a conductive material. In this case, the soldering paste is not fused on the ceramic body 12 of the chip capacitor 10. Thus, as illustrated in FIG. 7, the wet solder paste of the land patterns 122 and 124 may be soldered to internal edges 44 of the external electrodes 40 along the connection electrode pad 58 formed on lateral surfaces of the space 55. In this case, the head surfaces 42 or the lateral surfaces 49 of the external electrodes 40 may not be subjected to soldering due to the non-electrode margin portion 520 formed on the interposer 50.

Here, the internal edges 44 of the external electrodes 40 may be disposed adjacently to the space 55.

FIG. 8 illustrates that the internal edges 44 of the external electrodes 40 are disposed on the first electrode pattern 542 and the second electrode pattern 544, according to an embodiment of the present disclosure. FIG. 9 illustrates that the internal edges 44 of the external electrodes 40 are substantially formed above the space 55.

The embodiment of FIG. 9 may be more advantageous in terms of bonding strength, in that a greater amount of solder 142 may be applied to the internal edges 44 of the external electrodes 40.

As set forth above, according to exemplary embodiments of the present disclosure, an electronic chip component and a board having the same mounted thereon may remarkably reduce acoustic noise.

While exemplary embodiments have been shown and described above, it will be apparent to those skilled in the art that modifications and variations could be made without departing from the spirit and scope of the present disclosure as defined by the appended claims.

What is claimed is:

1. An electronic chip component comprising:
a ceramic body;
external electrodes formed on end portions of the ceramic body in a length direction thereof; and
an interposer supporting the ceramic body and electrically connected to the external electrodes,
wherein the interposer includes a first electrode pad formed on a surface thereof and having the external electrodes disposed thereon, a second electrode pad formed on an opposing surface thereof, and a connection electrode pad connecting the first electrode pad to the second electrode pad and formed on a lateral surface of the interposer between the surface and the opposing surface of the interposer,
the first electrode pad is divided into a first electrode pattern and a second electrode pattern disposed at ends of the interposer based on a space formed therebetween,
a non-electrode margin portion is formed between ends of the first electrode pad in a length direction of the interposer and the ends of the interposer in the length direction thereof, and
the connection electrode pad is formed on the lateral surface of the interposer forming the space.

2. The electronic chip component of claim 1, wherein the space is provided as a through hole, and
the through hole is disposed in a central portion of the interposer.

3. The electronic chip component of claim 1, wherein the space is provided as indent portions formed inwardly from ends of the interposer in a width direction thereof.

4. The electronic chip component of claim 1, wherein head surfaces of the external electrodes are disposed on the non-electrode margin portion when the external electrodes are disposed on the interposer.

5. The electronic chip component of claim 1, wherein the non-electrode margin portion is further formed on ends of the interposer in a width direction thereof, and
lateral surfaces of the external electrodes are disposed on the non-electrode margin portion when the external electrodes are disposed on the interposer.

6. The electronic chip component of claim 1, wherein the external electrodes are extended inwardly from the end portions of the ceramic body in the length direction thereof, and
internal edges of the external electrodes are disposed adjacently to the space when the external electrodes are disposed on the interposer.

7. The electronic chip component of claim 6, wherein the internal edges of the external electrodes are disposed above the space.

8. The electronic chip component of claim 6, wherein the internal edges of the external electrodes are disposed on the first electrode pattern and the second electrode pattern.

9. The electronic chip component of claim 1, wherein the ceramic body includes internal electrodes and dielectric layers alternately stacked therein, and
   the internal electrodes are disposed in parallel to the first electrode pad.

10. A board having an electronic chip component mounted thereon, the board comprising:
   the electronic chip component of claim 1; and
   a printed circuit board (PCB) including land patterns electrically connected to the second electrode pad to be connected to the electronic chip component,
   wherein the land patterns are soldered to be electrically connected to the external electrodes through the connection electrode pad disposed in the space.

11. The board of claim 10, wherein the space is provided as a through hole having a rectangular shape, and
   the electronic chip component is soldered along the connection electrode pad in the through hole.

12. The board of claim 10, wherein the space is provided as indent portions formed inwardly from ends of the interposer in a width direction thereof, and
   the electronic chip component is soldered along the connection electrode pad in the indent portions.

13. The board of claim 10, wherein head surfaces of the external electrodes are disposed on the non-electrode margin portion when the external electrodes are disposed on the interposer.

14. The board of claim 10, wherein the non-electrode margin portion is further formed on ends of the interposer in a width direction thereof, and
   lateral surfaces of the external electrodes are disposed on the non-electrode margin portion when the external electrodes are disposed on the interposer.

15. The board of claim 10, wherein the external electrodes are extended inwardly from the end portions of the ceramic body in the length direction thereof, and
   internal edges of the external electrodes are disposed adjacently to the space when the external electrodes are disposed on the interposer.

16. The board of claim 15, wherein the internal edges of the external electrodes are disposed above the space.

17. The board of claim 15, wherein the internal edges of the external electrode are disposed on the first electrode pattern and the second electrode pattern.

18. The board of claim 10, wherein the ceramic body includes internal electrodes and dielectric layers alternately stacked therein, and
   the internal electrodes are disposed in parallel to the first electrode pad.

* * * * *